United States Patent
Hsu et al.

(10) Patent No.: US 10,925,162 B1
(45) Date of Patent: Feb. 16, 2021

(54) PRINTED CIRCUIT BOARD

(71) Applicant: Wiwynn Corporation, New Taipei (TW)

(72) Inventors: Cheng Fu Hsu, New Taipei (TW); Cheng Wei Lin, New Taipei (TW); Ting-Kai Wang, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 0 days.

(21) Appl. No.: 16/858,754

(22) Filed: Apr. 27, 2020

(30) Foreign Application Priority Data

Mar. 17, 2020 (TW) .................................. 109108680

(51) Int. Cl.
  *H05K 1/11* (2006.01)
(52) U.S. Cl.
  CPC ....... *H05K 1/115* (2013.01); *H05K 2201/093* (2013.01); *H05K 2201/09609* (2013.01)
(58) Field of Classification Search
  CPC .............................. H05K 1/115; H05K 1/116
  USPC .................................................. 361/792–795
  See application file for complete search history.

(56) References Cited

U.S. PATENT DOCUMENTS

| | | | |
|---|---|---|---|
| 6,657,130 B2 * | 12/2003 | Van Dyke | H01L 23/49822 174/255 |
| 2010/0276187 A1 * | 11/2010 | Nakamura | H05K 3/462 174/258 |
| 2012/0090884 A1 | 4/2012 | Huang et al. | |

FOREIGN PATENT DOCUMENTS

TW  201218891  5/2012

OTHER PUBLICATIONS

"Office Action of Taiwan Counterpart Application", dated Dec. 15, 2020, with brief English summary thereof, p. 1-p. 10.

* cited by examiner

*Primary Examiner* — Jeremy C Norris
(74) *Attorney, Agent, or Firm* — JCIPRNET

(57) ABSTRACT

A printed circuit board is provided. The printed circuit board includes N power layers and a first via group. The N power layers are arranged in parallel and spaced from each other. The first via group includes M rows of vias which are disposed through the N power layers, where N and M are positive integers greater than 0. Each row of the M rows of vias is electrically connected to the first layer of the N power layers. A $P^{th}$ row of the M rows of vias is further electrically connected to Q power layers of the N power layers respectively, where Q is a smallest positive integer greater than or equal to $P((N-1)/M)$, and P is a positive integer less than or equal to M.

15 Claims, 3 Drawing Sheets

PRINTED CIRCUIT BOARD

CROSS-REFERENCE TO RELATED APPLICATION

This application claims the priority benefit of Taiwan application serial no. 109108680, filed on Mar. 17, 2020. The entirety of the above-mentioned patent application is hereby incorporated by reference herein and made a part of this specification.

BACKGROUND

Technical Field

The disclosure relates to a power transmission element, and particularly, to a printed circuit board configured to provide a power rail.

Description of Related Art

A printed circuit board is generally formed by a plurality of power layers arranged in parallel and spaced from each other, and may include, for example, a plurality of vias arranged in an array. The vias may be electrically connected to a power supply unit or a load unit to receive or transmit a current. It should be noted that an amount of current that each of the plurality of vias arranged in an array is subject to varies along with a distance of electrical connection to the power supply unit or the load unit. In general, a part of the plurality of vias arranged in an array which are close to the power supply unit or the load unit often may be subject to a great amount of current, which leads to over-temperature of the part of vias. Therefore, several embodiments of solutions will be proposed below with respect to how to design a special printed circuit board architecture to improve the over-heating problem of the vias of the printed circuit board.

Some terms may be used in the entire specification of the invention and the appended claims to refer to particular elements. It should be understood by a person skilled in the art that a device manufacturer may use different names to refer to the same element. This article is not intended to distinguish a person elements with the same function but different names. In the following specification and claims, the words such as "include" and "comprise" are open words, and thus should be interpreted as "include, but not limited to . . . ".

SUMMARY

The invention is directed to a printed circuit board, which may effectively improve over-heating problem of vias of the printed circuit board to provide a better power transmission effect.

The printed circuit board of the invention includes N power layers and a first via group.

The N power layers are arranged in parallel and spaced from each other. The first via group includes M rows of vias which are disposed through the N power layers, where N and M are positive integers greater than 0. Each row of the M rows of vias is electrically connected to a first layer of the N power layers. A $P^{th}$ row of the M rows of vias is further electrically connected to Q power layers of the N power layers respectively, where Q is a smallest positive integer greater than or equal to $P((N-1)/M)$, and P is a positive integer less than or equal to M.

In an embodiment of the invention, the Q power layers are an $N^{th}$ layer to an $(N-Q+1)^{th}$ layer of the N power layers.

In an embodiment of the invention, N is 3, and M is 2.

In an embodiment of the invention, N is 4, and M is 3.

In an embodiment of the invention, the first via group is disposed on a first side of the printed circuit board. The N power layers transmit a current towards a first direction away from the first side of the printed circuit board.

In an embodiment of the invention, the first layer of the N power layers of the printed circuit board is electrically connected to a first power source from the first side of the printed circuit board to cause the current provided by the first power source to be transmitted towards the first direction.

In an embodiment of the invention, a first row to an $M^{th}$ row of the M rows of vias are sequentially arranged along the first direction.

In an embodiment of the invention, the first via group is electrically connected to a power connector in a second direction perpendicular to the printed circuit board to cause the current provided by the power connector to be transmitted towards the first direction.

In an embodiment of the invention, a first row to an $M^{th}$ row of the M rows of vias are sequentially arranged along a direction opposite to the first direction.

In an embodiment of the invention, the printed circuit board further includes a second via group. The second via group includes K rows of vias. The K rows of vias are disposed through the N power layers, where K is a positive integer greater than 0. Each row of the K rows of vias is electrically connected to the first layer of the N power layers. An $R^{th}$ row of the K rows of vias is further electrically connected to S power layers of the N power layers respectively, where S is a smallest positive integer greater than or equal to $R((N-1)/K)$, and R is a positive integer less than or equal to K.

In an embodiment of the invention, the S power layers are an $N^{th}$ layer to an $(N-S+1)^{th}$ layer of the N power layers.

In an embodiment of the invention, the second via group is disposed on a second side of the printed circuit board. The N power layers transmit the current towards the second side from the first side of the printed circuit board.

In an embodiment of the invention, the first layer of the N power layers of the printed circuit board is electrically connected to a load from the second side of the printed circuit board. The load is configured to receive the current.

In an embodiment of the invention, a first row to a $K^{th}$ row of the K rows of vias are sequentially arranged along a third direction away from the second side of the printed circuit board.

In an embodiment of the invention, each via in the first via group and the second via group is a hollow metal cylinder.

Based on the above, the printed circuit board of the invention can improve the overheating problem of the vias of the printed circuit board by means of the design of special electrical connections between the power layers and the vias.

To enable the above features and advantages of the invention to be more comprehensible, the invention is described in detail below through embodiments with reference to the accompanying drawings.

DESCRIPTION OF THE EMBODIMENTS

Figure 1:
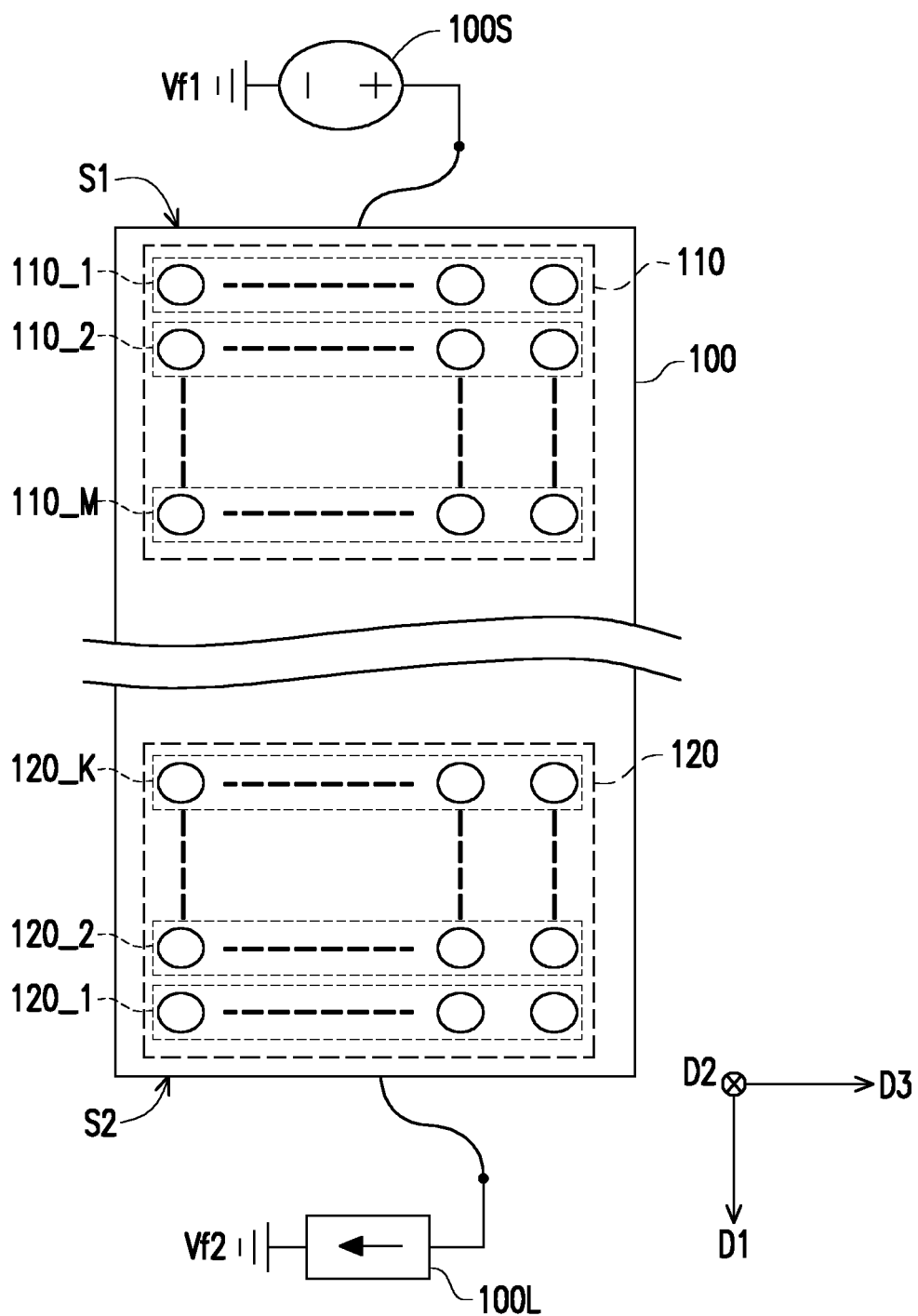
FIG. 1 is a schematic top view of a printed circuit board according to an embodiment of the invention.

To make the contents of the invention more easily understood, the invention is described below with embodiments; however, the invention is not limited to the embodiments illustrated. An appropriate combination between the embodiments is also allowed.

The wording "electrically connect (or couple)" used in the full text (including the claims) of the specification of the disclosure may refer to any direct or indirect connection means. For example, if it is described herein that a first apparatus is electrically connected (or coupled) to a second apparatus, it should be interpreted as that the first apparatus may be directly connected to the second apparatus or the first apparatus may be indirectly connected to the second apparatus through another apparatus or a connection means. The terms such as "first" and "second" mentioned in the full text (including the claims) of the specification of the disclosure may be used to name elements or to distinguish different embodiments or scopes and are not used to limit an upper or lower limit of the number of elements or to limit the order of the elements. In addition, where possible, elements/members/steps with the same reference numerals in the figures and detailed description represent the same or similar parts. The elements/members/steps with the same reference numerals or the same expressions in different embodiments can be cross-referenced for related descriptions.

FIG. 1 is a schematic top view of a printed circuit board according to an embodiment of the invention. Referring to FIG. 1, the printed circuit board 100 is composed of N power layers, and includes a first via group 110 and a second via group 120, where N is a positive integer greater than 0. The N power layers are parallel to a plane formed by extension along a direction D1 and a direction D3, and the N power layers are spaced from each other along a direction D2, where the directions D1, D2, and D3 are perpendicular to each other. In the present embodiment, an insulting layer exists between each two of the N power layers of the printed circuit board 100. In the present embodiment, the first via group 110 includes M rows of vias 110_1 and 110_2-110_M arranged in an array, and the M rows of vias are disposed through the N power layers along the direction D2, where M is a positive integer greater than 0. The second via group 120 includes K rows of vias 120_1 and 120_2-120_K arranged in an array, and the K rows of vias are disposed through the N power layers along the direction D2, where K is a positive integer greater than 0. Each row of vias in the first via group 110 and the second via group 120 may include one or more vias, which is not limited in the invention. In addition, each via in the first via group 110 and the second via group 120 may be, for example, a hollow metal cylinder.

In the present embodiment, the first via group 110 may be disposed on a first side S1 of the printed circuit board 100, and the first layer of the N power layers of the printed circuit board 100 is electrically connected to one end of a power source 100S from the first side S1 of the printed circuit board 100. The other end of the power source 100S is electrically connected to a reference potential Vf1. The second via group 120 may be disposed on a second side S2 of the printed circuit board 100, and the first layer of the N power layers of the printed circuit board 100 is electrically connected to one end of a load 100L from the second side S2 of the printed circuit board 100. The other end of the load 100L is electrically connected to a reference potential Vf2. The first via group 110, the second via group 120, and the N power layers form a power rail to cause the power source 100S to transmit a current through the printed circuit board 100 and the load 100L to receive the current through the printed circuit board 10. In the present invention, the current provided by the power source 100S is transmitted towards a direction D1 away from the first side S1 of the printed circuit board 100 through the N power layers of the printed circuit board 100 to the load 100L on the second side S2 of the printed circuit board 100.

It should be noted that since the current is input from the first side S1 of the printed circuit board 100, vias close to the first side S1 are easily subject to a large amount of current. Moreover, since the current is output from the second side S2 of the printed circuit board 100, vias close to the second side S2 easily converge a large amount of current. Regarding this, in the present embodiment, the number of the N power layers electrically connected to each row of the M rows of vias 110_1 and 110_2-110_M in the first via group 110 and the K rows of vias 120_1 and 120_2-120_K in the second via group 120 is different. In the present embodiment, the first row to the $M^{th}$ row of the M rows of vias in the first via group 110 are sequentially arranged along the direction D1, and the first row to the $K^{th}$ row of the K rows of vias in the second via group 120 are sequentially arranged along a direction opposite to the direction D1.

Specifically, an electrical connection rule for the power rail architecture in the present embodiment is that each row of the M rows of vias 110_1 and 110_2-110_M in the first via group 110 is electrically connected to the first layer of the N power layers and the $P^{th}$ row of vias in the first via group 110 are electrically connected to Q of the N power layers, where Q is a positive integer greater than or equal to P((N−1)/M), and P is a positive integer less than or equal to M. In other words, the number of the power layers electrically connected to the first row of vias 110_1 in the first via group 110 in the present embodiment is minimum, and the number of the power layers electrically connected to the $M^{th}$ row of vias 110_M in the first via group 110 is maximum. Moreover, the Q power layers are the $N^{th}$ layer to the $(N-Q+1)^{th}$ layer of the N power layers. Therefore, the first row of vias 110_1 in the first via group 110 in the present embodiment may avoid being subject to an excessive amount of current, which effectively reduces the occurrence of overheating of the vias.

Likewise, each row of the K rows of vias 120_1 and 120_2-120_K in the second via group 120 is electrically connected to the first layer of the N power layers, and the $R^{th}$ row of vias in the second via group 120 are electrically connected to S of the N power layers, where S is a positive integer greater than or equal to R((N−1)/K), and R is a positive integer less than or equal to K. In other words, the number of the power layers electrically connected to the first row of vias 120_1 in the second via group 120 in the present embodiment is minimum, and the number of the power layers electrically connected to the $K^{th}$ row of vias 120_K in the second via group 120 is maximum. Moreover, the S power layers are the $N^{th}$ layer to the $(N-S+1)^{th}$ layer of the N power layers. Therefore, the first row of vias 120_1 in the second via group 120 in the present embodiment may avoid being subject to an excessive amount of current, which effectively reduces the occurrence of overheating of the vias.

In the present embodiment, the first side S1 of the printed circuit board 100 is opposite the second side S2, and the first via group 110 and the second via group 120 may be symmetrically electrically connected to the N power layers respectively. However, in another embodiment of the present embodiment, the first side S1 of the printed circuit board 100 may also be adjacent to or on the same side as the second side S2, but is not limited to the relative position relationship shown in FIG. 1. Moreover, to enable a person skilled in the art to further understand the design spirit of the special electrical connection architecture of the power rail in the invention, two exemplary embodiments of FIG. 2 and FIG. 3 will be proposed below to provide further illustration.

Figure 2:
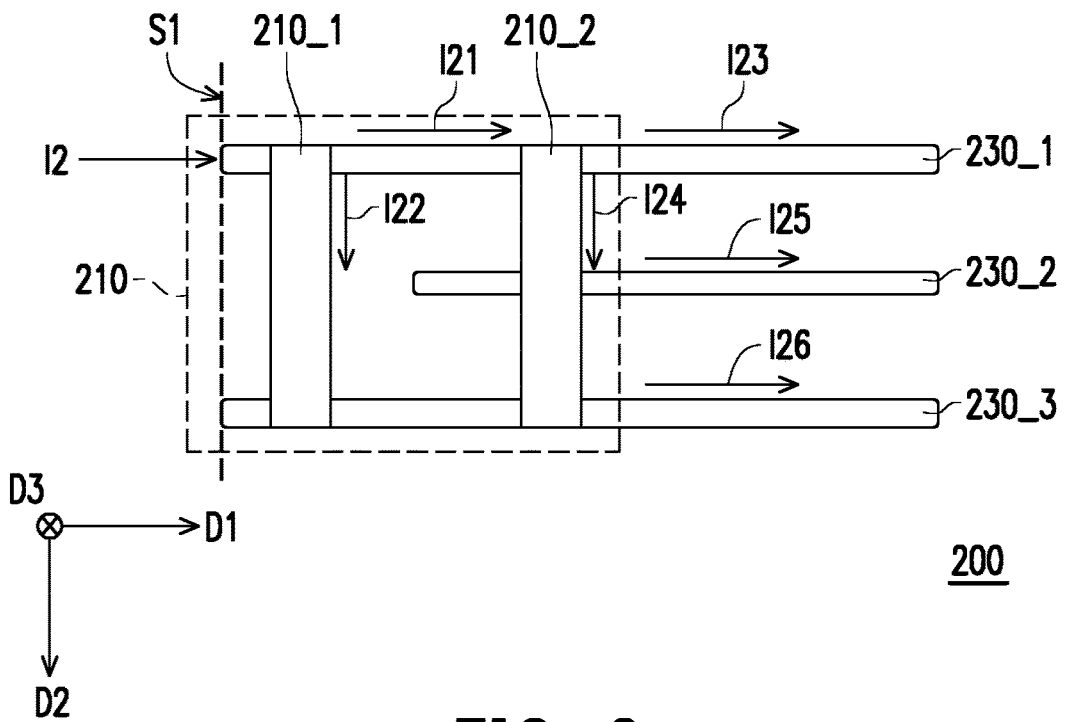
FIG. 2 is a side cross-sectional view of a first embodiment of a via group according to the invention.

FIG. 2 is a side cross-sectional view of a first embodiment of a via group according to the invention. Referring to FIG. 2, a printed circuit board 200 may be, for example, a side cross-sectional view of an embodiment of the printed circuit board 100 in the embodiment of FIG. 1, and the power rail architecture of the present embodiment satisfies the electrical connection rule in FIG. 1. The printed circuit board 200 is composed of three power layers 230_1-230_3 (i.e., N=3 in the embodiment of FIG. 1 is satisfied). A first side S1 of the printed circuit board 200 includes a via group 210, and the via group 210 includes two rows of vias 210_1 and 210_2 (i.e., M=2 in the embodiment of FIG. 1 is satisfied), where the first row of vias 210_1 and the second row of vias 210_2 are disposed through the three power layers 230_1-230_3 along the direction D2. The first row of vias 210_1 and the second row of vias 210_2 may include one or more vias sequentially arranged along the direction D3 respectively.

In the present embodiment, the first row of vias 210_1 and the second row of vias 210_2 in the via group 210 are electrically connected to the first power layer 230_1. The first row of vias 210_1 is further electrically connected to the third power layer 230_3 (i.e., P=1 and Q=1 in the embodiment of FIG. 1 are satisfied, where Q is a smallest positive integer "1" greater than or equal to 1*((3−1)/2)). The second row of vias 210_2 are further electrically connected to the second power layer 230_2 and the third power layer 230_3 (i.e., P=2 and Q=2 in the embodiment of FIG. 1 are satisfied, where Q is a smallest positive integer "2" greater than or equal to 2*((3−1)/2)).

In the present embodiment, the first power layer 230_1 on the first side S1 of the printed circuit board 200 receives a current I2 provided from the power source, and the current I2 flows towards the direction D1. It should be noted that from the perspective of equivalent resistances, it is assumed that respective equivalent resistances of the power layers 230_1-230_3 are much greater than respective equivalent resistances of the first row of vias 210_1 and the second row of vias 210_2; therefore, for a shunt current I21, a shunt path of the shunt current I21 corresponds to an equivalent resistance formed by parallel connection of the first power layer 230_1, the second power layer 230_2, and the third power layer 230_3 (a parallel resistance will be less than each resistance connected in parallel). Moreover, for a shunt current I22, a shunt path of the shunt current I22 corresponds to only an equivalent resistance provided by the third power layer 230_3. In other words, the equivalent resistance corresponding to the shunt path of the shunt current I21 will be less than that corresponding to the shunt path of the shunt current I22. Therefore, when the current I2 flows through the first row of vias 210_1, the shunt current I21 shunted to the first power layer 230_1 will be greater than the shunt current I22 shunted to the first row of vias 210_1. The shunt current I22 for the first row of vias 210_1 will flow from the third power layer 230_3 to a load side of the printed circuit board 200. Therefore, in the present embodiment, if the current I2 is large, the first row of vias 210_1 will not be subject to an excessive amount of current to lead to over-temperature.

Likewise, when the shunt current I21 flows through the second row of vias 210_2, the first power layer 230_1 is subject to another part of a shunt current I23 of the shunt current I21, and the second row of vias 210_2 are subject to a part of a shunt current I24 of the shunt current I21. Next, most of the shunt current I24 is shunted to the second power layer 230_2, and a small part of the shunt current I24 is shunted to the third power layer 230_3 (the shunt current I24 mainly flows to the second power layer 230_2). Therefore, in an ideal situation, the amount of current of the shunt current I21 may be approximately two-thirds that of the current I2. The amount of current of the shunt current I22 may be approximately one-third that of the current I2. The amount of current of the shunt currents I23, I24, I25, and I26 may be approximately one-third that of the current I2 respectively, but the shunting results of the amount of current of the shunt currents are not limited in the invention.

In addition, electrical connections between another via group of the printed circuit board 200 coupled to the other side of the load and the three power layers 230_1-230_3 may be symmetric with the electrical connections of the via group 210 shown in FIG. 2. Therefore, the another via group of the printed circuit board 200 coupled to the other side of the load may be analogized from the architectural design of the via group 210, and is not described in detail here.

Figure 3:
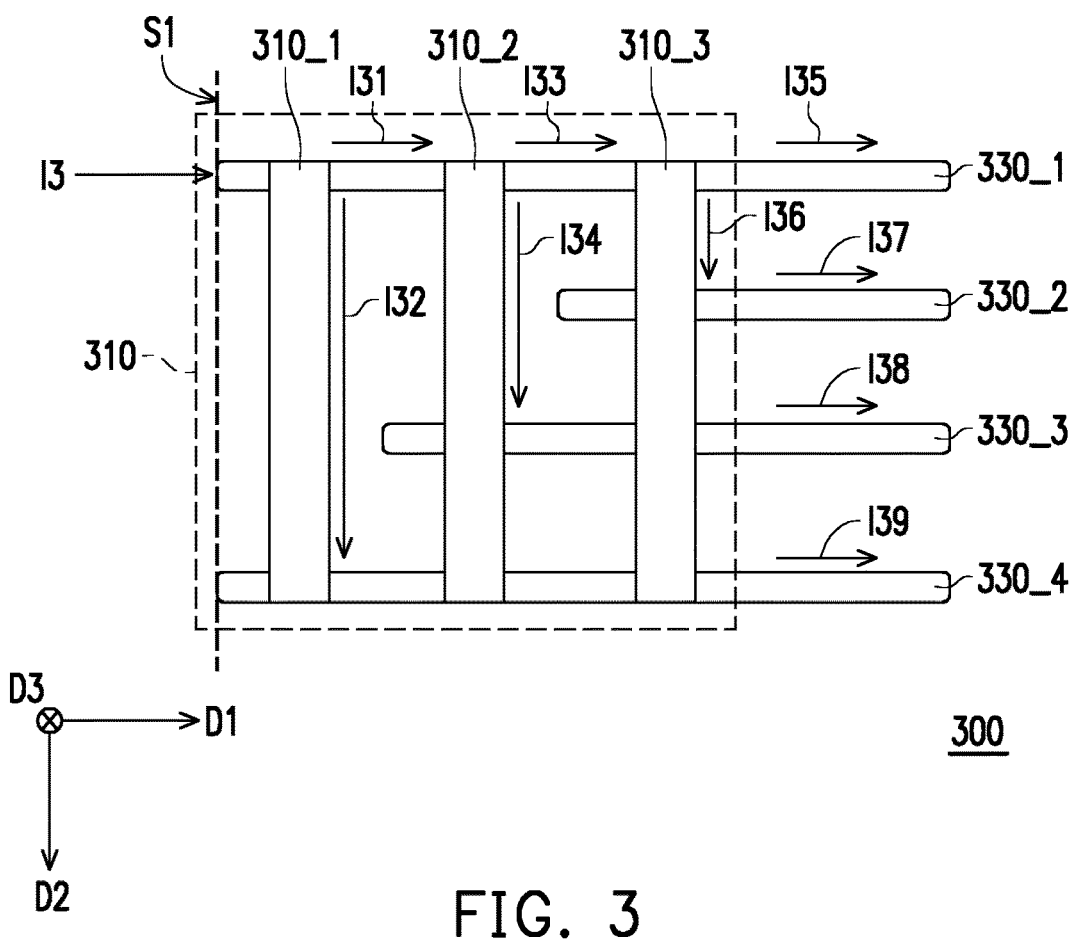
FIG. 3 is a side cross-sectional view of a second embodiment of a via group according to the invention.

FIG. 3 is a side cross-sectional view of a second embodiment of a via group according to the invention. Referring to FIG. 3, a printed circuit board 300 may be, for example, a side cross-sectional view of an embodiment of the printed circuit board 100 in the embodiment of FIG. 1, and the power rail architecture of the present embodiment satisfies the electrical connection rule in FIG. 1. The printed circuit board 300 is composed of four power layers 330_1-330_4 (i.e., N=4 in the embodiment of FIG. 1 is satisfied). A first side S1 of the printed circuit board 300 includes a via group 310, and the via group 310 includes three rows of vias 310_1, 310_2, and 310_3 (i.e., M=3 in the embodiment of FIG. 1 is satisfied), where the first row of vias 310_1, the second row of vias 310_2, and the third row of vias 310_3 are disposed through the four power layers 330_1-330_4 along the direction D2. The first row of vias 310_1, the second row of vias 310_2, and the third row of vias 310_3 may include one or more vias sequentially arranged along the direction D3 respectively.

In the present embodiment, the first row of vias 310_1, the second row of vias 310_2, and the third row of vias 310_3 in the via group 310 are electrically connected to the first power layer 330_1. The first row of vias 310_1 is further electrically connected to the fourth power layer 330_4 (i.e., P=1 and Q=1 in the embodiment of FIG. 1 are satisfied, where Q is a smallest positive integer "1" greater than or equal to 1*((4−1)/3)). The second row of vias 310_2 are further electrically connected to the third power layer 330_3 and the fourth power layer 330_4 (i.e., P=2 and Q=2 in the embodiment of FIG. 1 are satisfied, where Q is a smallest positive integer "2" greater than or equal to 2*((4−1)/3)). The third row of vias 310_3 are further electrically connected to the second power layer 330_2, the third power layer 330_3, and the fourth power layer 330_4 (i.e., P=3 and Q=3 in the embodiment of FIG. 1 are satisfied, where Q is a smallest positive integer "3" greater than or equal to 3*((4−1)/3)).

In the present embodiment, the first power layer 330_1 on the first side S1 of the printed circuit board 300 receives a current I3 provided from the power source, and the current I3 flows towards the direction D1. It should be noted that from the perspective of equivalent resistances, it is assumed that respective equivalent resistances of the power layers 330_1-330_4 are much greater than respective equivalent resistances of the first row of vias 310_1, the second row of vias 310_2, and the third row of vias 310_3; therefore, for a shunt current I31, a shunt path of the shunt current I31 corresponds to an equivalent resistance formed by parallel connection of the first power layer 330_1, the second power layer 330_2, the third power layer 330_3, and the fourth power layer 330_4 (a parallel resistance will be less than each resistance connected in parallel). Moreover, for a shunt current I32, a shunt path of the shunt current I32 corresponds to only an equivalent resistance provided by the fourth power layer 330_4. In other words, the equivalent resistance corresponding to the shunt path of the shunt current I31 will be less than that corresponding to the shunt path of the shunt current I32. Therefore, when the current I3 flows through the first row of vias 310_1, the shunt current I31 shunted to the first power layer 330_1 will be greater than the shunt current I32 shunted to the first row of vias 310_1. The shunt current I32 for the first row of vias 310_1 will flow from the fourth power layer 330_4 to a load side of the printed circuit board 300. Therefore, in the present embodiment, if the current I3 is large, the first row of vias 310_1 will not be subject to an excessive amount of current to lead to over-temperature.

Likewise, when the shunt current I31 flows through the second row of vias 310_2, the second row of vias 310_2 are subject to a part of a shunt current I34 of the shunt current I31, and another part of a shunt current I33 of the shunt current I31 flows to the third row of vias 310_3. Next, most of the shunt current I34 is shunted to the third power layer 330_3, and a small part of the shunt current I34 is shunted to the fourth power layer 330_4 (the shunt current I34 mainly flows to the third power layer 330_3).

Moreover, when the shunt current I33 flows through the third row of vias 310_3, the third row of vias 310_3 are subject to a part of a shunt current I36 of the shunt current I33, and another part of a shunt current I35 of the shut current I36 flows to the load side of the printed circuit board 300 through the first power layer 330_1. Next, most of a shunt current I37 of the shunt current I36 is shunted to the second power layer 330_2. A small part of the shunt current I36 plus a shunt current I38 of the shunt current I34 flow to the load side of the printed circuit board 300 through the third power layer 330_3, and a further small part of the shunt current I36 plus a shunt current I39 of the shunt current I32 flow to the load side of the printed circuit board 300 through the fourth power layer 330_4 (the shunt current I36 mainly flows to the second power layer 330_2). Therefore, in an ideal situation, the amount of current of the shunt current I31 may be approximately three-fourths that of the current I3. The amount of current of the shunt current I32 may be approximately one-fourth that of the current I3. The amount of current of the shunt current I33 may be approximately two-fourths that of the current I3. The amount of current of the shunt currents I34, I35, I36, I37, I38, and I39 may be approximately one-fourth that of the current I3 respectively, but the shunting results of the amount of current of the shunt currents are not limited in the invention.

In addition, electrical connections between another via group of the printed circuit board 300 coupled to the other side of the load and the four power layers 330_1-330_4 may be symmetric with the electrical connections of the via group 310 shown in FIG. 3. Therefore, the another via group of the printed circuit board 300 coupled to the other side of the load may be analogized from the architectural design of the via group 310, and is not described in detail here.

Figure 4:
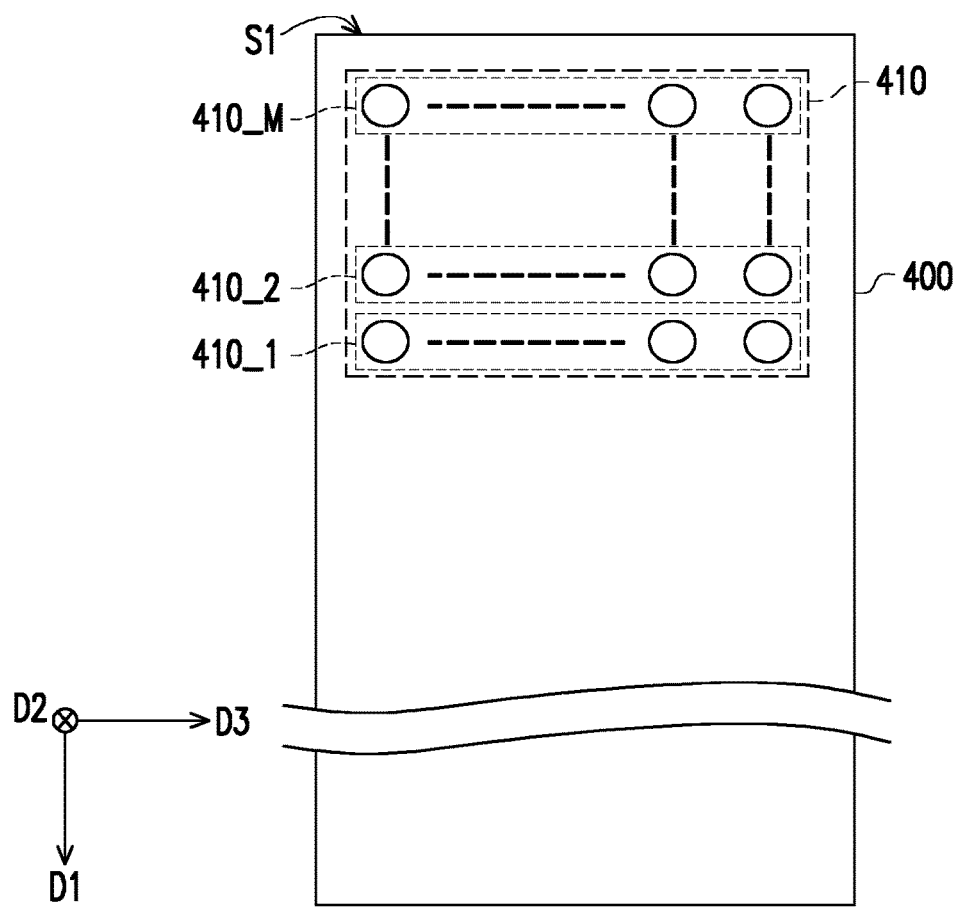
FIG. 4 is a schematic top view of a printed circuit board according to another embodiment of the invention.

FIG. 4 is a schematic top view of a printed circuit board according to another embodiment of the invention. Referring to FIG. 4, the printed circuit board 400 is composed of N power layers, and includes a via group 410, where N is a positive integer greater than 0. The N power layers are parallel to a plane formed by extension along a direction D1 and a direction D3, and the N power layers are spaced from each other along a direction D2. In the present embodiment, an insulting layer exists between each two of the N power layers of the printed circuit board 100. In the present embodiment, the via group 410 includes M rows of vias 410_1 and 410_2-410_M arranged in an array, and the M rows of vias are disposed through the N power layers along the direction D2, where M is a positive integer greater than 0. Each row of vias in the via group 410 may include one or more vias, which is not limited in the invention. In addition, each via in the via group 410 may be, for example, a hollow metal cylinder.

In the present invention, the via group 410 may be disposed on a first side S1 of the printed circuit board 400, and the first layer of the N power layers of the printed circuit board 400 is vertically electrically connected to a power connector from the direction D2 of the printed circuit board 400 to receive a current provided by the power connector from the direction D2. The via group 410, the N power layers, and a via group on the other side (load side) of the other side form a power rail. It should be noted that since the current is vertically input to the printed circuit board 100, a via on the innermost side of the printed circuit board 100 (the via farthest from the first side of the printed circuit board 100) is easily subject to a large amount of current. Therefore, compared with the embodiment of FIG. 1, the via group 410 in FIG. 4 and the via group 110 in FIG. 1 are different in a row order of the vias. In the present embodiment, the first row to the $M^{th}$ row of the M rows of vias in the first via group 410 are sequentially arranged along a direction opposite to the direction D1.

Specifically, each row of the M rows of vias 410_1 and 410_2-410_M in the via group 410 is electrically connected to the first layer of the N power layers, and the $P^{th}$ row of vias in the first via group 410 are electrically connected to Q of the N power layers, where Q is a positive integer greater than or equal to P((N−1)/M), and P is a positive integer less than or equal to K. In other words, the number of the power layers electrically connected to the first row of vias 410_1 in the first via group 410 in the present embodiment is minimum, and the number of the power layers electrically connected to the $M^{th}$ row of vias 410_M in the first via group 410 is maximum. Moreover, the Q power layers are the $N^{th}$ layer to the $(N-Q+1)^{th}$ layer of the N power layers. Therefore, the first row of vias 410_1 in the first via group 410 in the present embodiment may avoid being subject to an excessive amount of current, which effectively reduces the occurrence of overheating of the vias. Moreover, to enable a person skilled in the art to further understand the design spirit of the special electrical connection architecture of the power rail in the invention, an exemplary embodiment of FIG. 5 will be proposed below to provide further illustration.

Figure 5:
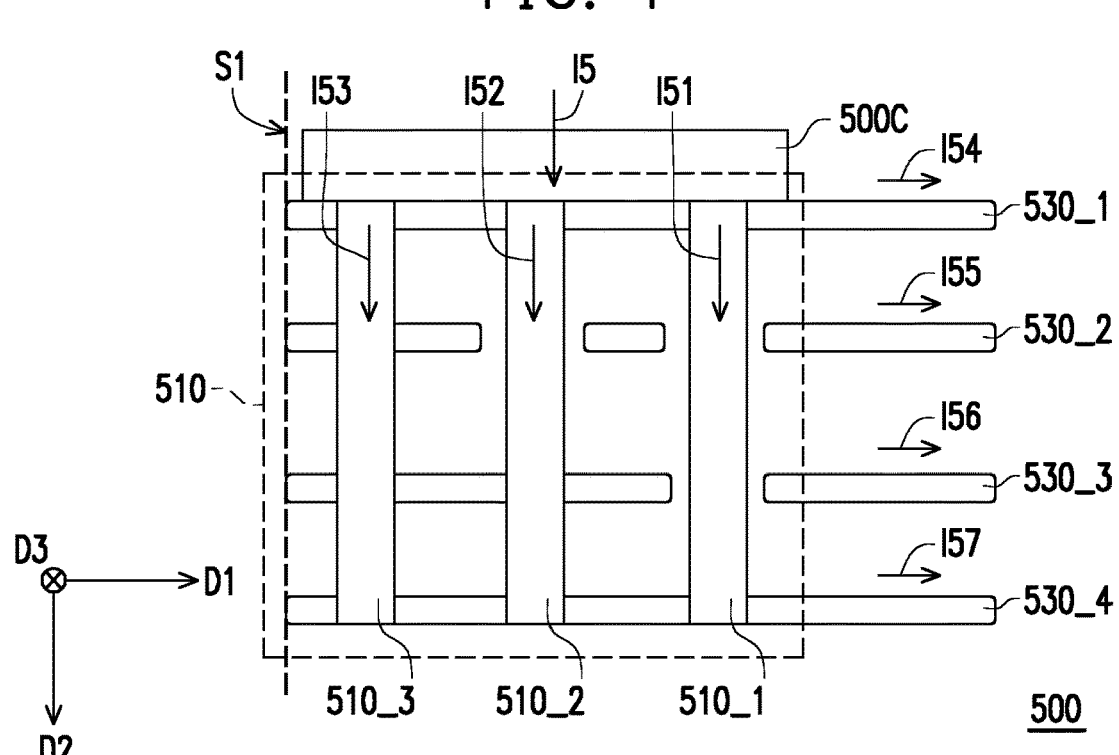
FIG. 5 is a side cross-sectional view of a third embodiment of a via group according to the invention.

FIG. 5 is a side cross-sectional view of a third embodiment of a via group according to the invention. Referring to FIG. 5, a printed circuit board 500 may be, for example, a side cross-sectional view of an embodiment of the printed circuit board 400 in the embodiment of FIG. 4, and the power rail architecture of the present embodiment satisfies the electrical connection rule in FIG. 4. The printed circuit board 500 is composed of four power layers 530_1-530_4 (i.e., N=4 in the embodiment of FIG. 4 is satisfied). A first side S1 of the printed circuit board 500 includes a via group 510, and the via group 510 includes three rows of vias 510_1, 510_2, and 510_3 (i.e., M=3 in the embodiment of FIG. 4 is satisfied), where the first row of vias 510_1, the second row of vias 510_2, and the third row of vias 510_3 is disposed through the four power layers 530_1-530_4 along the direction D2. The first row of vias 510_1, the second row of vias 510_2, and the third row of vias 510_3 may include one or more vias sequentially arranged along the direction D3 respectively.

In the present embodiment, the first row of vias 510_1, the second row of vias 510_2, and the third row of vias 510_3 in the via group 510 are electrically connected to the first power layer 530_1. The first row of vias 510_1 is further electrically connected to the fourth power layer 530_4 (i.e., P=4 and Q=1 in the embodiment of FIG. 1 are satisfied, where Q is a smallest positive integer "1" greater than or equal to $1*((4-1)/3)$). The second row of vias 510_2 is further electrically connected to the third power layer 530_3 and the fourth power layer 530_4 (i.e., P=2 and Q=2 in the embodiment of FIG. 4 are satisfied, where Q is a smallest positive integer "2" greater than or equal to $2*((4-1)/3)$). The third row of vias 510_3 is further electrically connected to the second power layer 530_2, the third power layer 530_3, and the fourth power layer 530_4 (i.e., P=3 and Q=3 in the embodiment of FIG. 4 are satisfied, where Q is a smallest positive integer "3" greater than or equal to $3*((4-1)/3)$).

In the present embodiment, the first power layer 530_1 on the first side S1 of the printed circuit board 500 is coupled to a power connector 500C in the direction D2 to receive a current I5 provided from the power source, and the current I5 is shunted through the first row of vias 510_1, the second row of vias 510_2, and the third row of vias 510_3. It should be noted that from the perspective of equivalent resistances, it is assumed that respective equivalent resistances of the power layers 530_1-530_4 are much greater than respective equivalent resistances of the first row of vias 510_1, the second row of vias 510_2, and the third row of vias 510_3; therefore, for a shunt current I51, a shunt path of the shunt current I51 corresponds to only an equivalent resistance provided by the fourth power layer 530_4, but the shunt path of the shunt current I51 is closer to the vias on the receiving side. In other words, since the first row of vias 510_1 is closest to the vias on the receiving side, the equivalent resistance provided by the fourth power layer 530_4 will be reduced. For a shunt current I52, a shunt path of the shunt current I52 corresponds to an equivalent resistance formed by parallel connection of the third power layer 530_3 and the fourth power layer 530_4 (a parallel resistance will be less than each resistance connected in parallel), but the shunt path of the shunt current I52 is less close to the vias on the receiving side. In other words, since the second row of vias 510_2 is less close to the vias on the receiving side, the equivalent resistances provided by the third power layer 530_3 and the fourth power layer 530_4 respectively will be reduced slightly. Moreover, for a shunt current I53, a shunt path of the shunt current I53 corresponds to an equivalent resistance formed by parallel connection of the second power layer 530_2, the third power layer 530_3, and the fourth power layer 530_4, but the shunt path of the shunt current I53 is farthest from the vias on the receiving side. In other words, since the third row of vias 510_3 is farthest from the vias on the receiving side, the equivalent resistances of the second power layer 530_2, the third power layer 530_3, and the fourth power layer 530_4 are almost unaffected by the distance from the vias on the receiving side.

Accordingly, by integrating the influences of distances from the power layers to the vias on the receiving side on the equivalent resistances, the equivalent resistance corresponding to the shunt path of the shunt current I51 will be slightly greater than that corresponding to the shunt path of the shunt current I52, and the equivalent resistance corresponding to the shunt path of the shunt current I52 will be slightly greater than that corresponding to the shunt path of the shunt current I53. Therefore, although the shunt current I51 shunted to the first row of vias 510_1 will be greater than the shunt currents I52 and I53 shunted to the second row of vias 510_2 and the third row of vias 510_3 and the shunt current I52 shunted to the second row of vias 510_2 will be greater than the shunt current I53 shunted to the third row of vias 510_3, the shunt current I51 will be smaller than the sum of the shunt current I52 and the shunt current I53. That is, if the current I5 is large, the first row of vias 510_1 will not be subject to an excessive amount of current to lead to over-temperature, although the amount of current of the shunt current I51 that the first row of vias 510_1 is subject to is still large.

Likewise, a part of the shunt current I51 is shunted to the first power layer 530_1, and the other part is shunted along the first row of vias 510_1 to the fourth power layer 530_4. A main part of the shunt current I52 is shunted along the second row of vias 510_2 to the third power layer 530_3, and the other small part is shunted to the first power layer 530_1 and shunted along the second row of vias 510_2 to the fourth power layer 530_4. A main part of the shunt current I53 is shunted along the third row of vias 510_3 to the second power layer 530_2, and the other small part is shunted to the first power layer 530_1 and shunted along the third row of vias 510_3 to the third power layer 530_3 and the fourth power layer 530_4. Therefore, in an ideal situation, the amount of current of the shunt currents I54, I55, I56, and I57 may be approximately one-fourth that of the current I5 respectively, but the shunting results of the amount of current of the shunt currents are not limited in the invention.

Based on the above, the printed circuit board of the invention includes a power rail formed by a plurality of power layers and a plurality of rows of vias arranged in an array, and the number of power layers electrically connected to the plurality of rows of vias of the printed circuit board of the invention respectively is different. Therefore, the printed circuit board of the invention can effectively improve the overheating problem of the vias of the printed circuit board based on the design of special electrical connections between the power layers and the vias disclosed in the invention.

The invention has been disclosed above with embodiments; however, the embodiments are not intended to limit the invention. Any person of ordinary skill in the art can make some changes and modifications without departing from the spirit and scope of the invention. Thus, the protection scope of the invention should be subject to that defined by the appended claims.

What is claimed is:

1. A printed circuit board comprising:

N power layers, arranged in parallel and spaced from each other; and a first via group, comprising M rows of vias which are disposed through the N power layers, where N and M are positive integers greater than 0, wherein each row of the M rows of vias is electrically connected to a first layer of the N power layers, and a $P^{th}$ row of the M rows of vias is disposed through all power layers, but only directly contacts Q power layers of the N power layers respectively, where Q is a smallest positive integer greater than or equal to $P((N-1)/M)$, and P is a positive integer less than or equal to M.

2. The printed circuit board according to claim 1, wherein the Q power layers are an $N^{th}$ layer to an $(N-Q)^{th}$ layer of the N power layers.

3. The printed circuit board according to claim 1, wherein N is 3, and M is 2.

4. The printed circuit board according to claim 1, wherein N is 4, and M is 3.

5. The printed circuit board according to claim 1, wherein the first via group is disposed on a first side of the printed circuit board, and the N power layers transmit a current towards a first direction away from the first side of the printed circuit board.

6. The printed circuit board according to claim 5, wherein the first layer of the N power layers of the printed circuit board is electrically connected to a first power source from the first side of the printed circuit board to cause the current provided by the first power source to be transmitted towards the first direction.

7. The printed circuit board according to claim 6, wherein a first row to an $M^{th}$ row of the M rows of vias are sequentially arranged along the first direction.

8. The printed circuit board according to claim 5, wherein the first via group is electrically connected to a power connector in a second direction perpendicular to the printed circuit board to cause the current provided by the power connector to be transmitted towards the first direction.

9. The printed circuit board according to claim 8, wherein a first row to an $M^{th}$ row of the M rows of vias are sequentially arranged along a direction opposite to the first direction.

10. The printed circuit board according to claim 5, further comprising:

a second via group, comprising K rows of vias which are disposed through the N power layers, where K is a positive integer greater than 0, wherein each row of the K rows of vias is electrically connected to the first layer of the N power layers, and an $R^{th}$ row of the K rows of vias is disposed through all power layers, but only directly contacts S power layers of the N power layers respectively, where S is a smallest positive integer greater than or equal to $R((N-1)/K)$, and R is a positive integer less than or equal to K.

11. The printed circuit board according to claim 10, wherein the S power layers are an $N^{th}$ layer to an $(N-S+1)^{th}$ layer of the N power layers.

12. The printed circuit board according to claim 10, wherein the second via group is disposed on a second side of the printed circuit board, and the N power layers transmit the current towards the second side from the first side of the printed circuit board.

13. The printed circuit board according to claim 12, wherein the first layer of the N power layers of the printed circuit board is electrically connected to a load from the second side of the printed circuit board, and the load is configured to receive the current.

14. The printed circuit board according to claim 13, wherein a first row to a $K^{th}$ row of the K rows of vias are sequentially arranged along a third direction away from the second side of the printed circuit board.

15. The printed circuit board according to claim 10, wherein each via in the first via group and the second via group is a hollow metal cylinder.

* * * * *